US008884796B2

(12) United States Patent
Wagner et al.

(10) Patent No.: US 8,884,796 B2
(45) Date of Patent: Nov. 11, 2014

(54) DELTA-SIGMA MODULATOR WITH FEEDBACK SIGNAL MODIFICATION

(75) Inventors: Horst Wagner, Westerstetten (DE); Udo Karthaus, Neu-Ulm (DE)

(73) Assignee: Kathrein-Werke KG, Rosenheim (DE)

( * ) Notice: Subject to any disclaimer, the term of this patent is extended or adjusted under 35 U.S.C. 154(b) by 0 days.

(21) Appl. No.: 13/277,688

(22) Filed: Oct. 20, 2011

(65) Prior Publication Data

US 2013/0099949 A1 Apr. 25, 2013

(51) Int. Cl.
*H03M 3/00* (2006.01)

(52) U.S. Cl.
CPC .............. *H03M 3/368* (2013.01); *H03M 3/454* (2013.01)
USPC ............ 341/143; 341/118; 341/120; 341/155

(58) Field of Classification Search
USPC .................................. 341/143, 118, 120, 155
See application file for complete search history.

(56) References Cited

U.S. PATENT DOCUMENTS

| | | | | |
|---|---|---|---|---|
| 5,598,158 A * | 1/1997 | Linz | | 341/143 |
| 5,654,711 A * | 8/1997 | Fujimori | | 341/143 |
| 5,742,246 A * | 4/1998 | Kuo et al. | | 341/143 |
| 5,805,093 A * | 9/1998 | Heikkila et al. | | 341/143 |
| 6,480,129 B1 * | 11/2002 | Melanson | | 341/143 |
| 6,489,907 B2 * | 12/2002 | Cusinato et al. | | 341/143 |
| 7,038,606 B2 * | 5/2006 | Hongoh et al. | | 341/143 |
| 7,215,270 B1 * | 5/2007 | Kozak et al. | | 341/143 |
| 7,420,493 B2 * | 9/2008 | Hochschild | | 341/143 |
| 7,852,249 B2 * | 12/2010 | Oliaei | | 341/143 |
| 8,159,380 B2 * | 4/2012 | Le Guillou et al. | | 341/143 |
| 2003/0080887 A1 * | 5/2003 | Havelock | | 341/143 |
| 2004/0036638 A1 * | 2/2004 | Lipka | | 341/143 |
| 2008/0152037 A1 * | 6/2008 | Kim et al. | | 375/297 |
| 2010/0219999 A1 * | 9/2010 | Oliaei et al. | | 341/143 |
| 2011/0096878 A1 * | 4/2011 | Mattisson | | 375/350 |
| 2011/0136443 A1 * | 6/2011 | Milenkovic et al. | | 455/76 |
| 2011/0156940 A1 * | 6/2011 | Le Guillou et al. | | 341/143 |

FOREIGN PATENT DOCUMENTS

EP 845867 4/2004

OTHER PUBLICATIONS

Frappe et al, "Design techniques for very high speed digital delta-sigma modulators aimed at all-digital RE transmitters", IEEE 1-4244-0395-2/06, 2006, pp. 1113-1116.

\* cited by examiner

*Primary Examiner* — Linh Nguyen
(74) *Attorney, Agent, or Firm* — Stephen H. Eland; Dann, Dorfman, Herrell & Skillman

(57) ABSTRACT

A delta-sigma modulator (1) for converting a delta-sigma modulator input signal into a sequence of delta-sigma modulator output values comprising an actual delta-sigma modulator output value and at least one preceding delta-sigma modulator output value preceding the actual delta-sigma modulator output value is presented. At least one feedback signal modifier for modifying a at least one first feedback signal in dependence of the actual delta-sigma modulator output value and the at least one preceding delta-sigma modulator output value is provided. By means of the at least one first feedback signal modifier the signal quality of a subsequent final stage (7) can be improved.

14 Claims, 2 Drawing Sheets

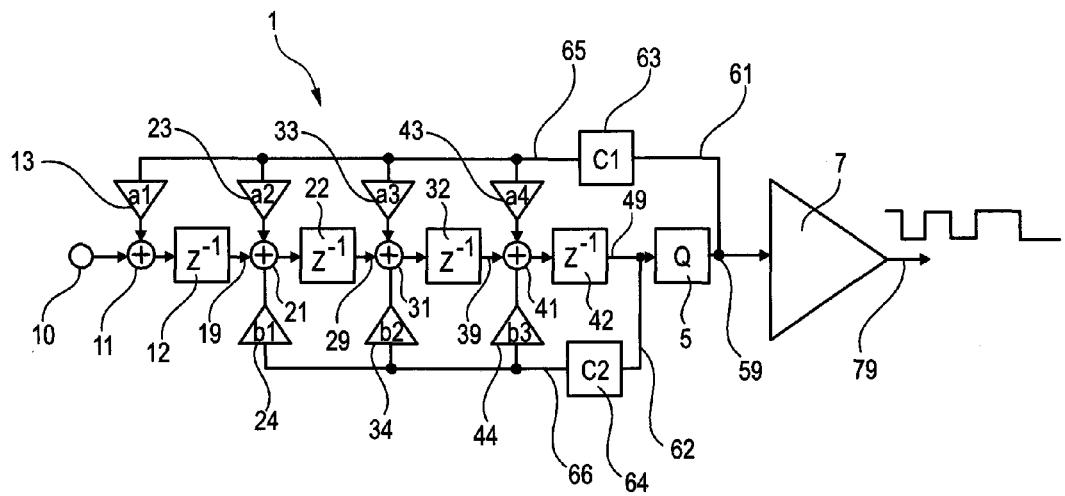
Fig. 1
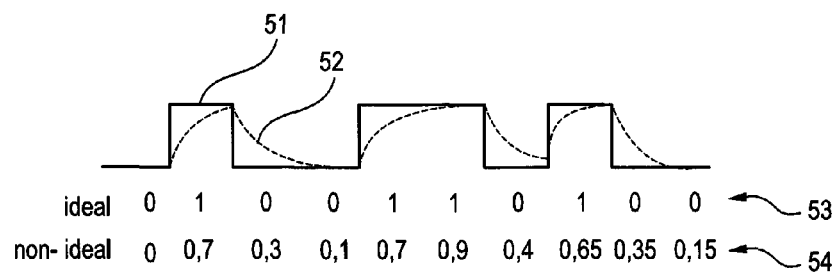
Fig. 2
| history | ideal output | actual output |
|---------|--------------|---------------|
| 000 | 0 | 0.00 |
| 100 | 0 | 0.05 |
| 010 | 0 | 0.10 |
| 110 | 0 | 0.15 |
| 001 | 0 | 0.30 |
| 101 | 0 | 0.35 |
| 011 | 0 | 0.40 |
| 111 | 0 | 0.45 |
| 000 | 1 | 0.55 |
| 100 | 1 | 0.60 |
| 010 | 1 | 0.65 |
| 110 | 1 | 0.70 |
| 001 | 1 | 0.85 |
| 101 | 1 | 0.90 |
| 011 | 1 | 0.95 |
| 111 | 1 | 1.00 |
Fig. 3

DELTA-SIGMA MODULATOR WITH FEEDBACK SIGNAL MODIFICATION

CROSS-REFERENCE TO RELATED APPLICATION

None

FIELD OF THE INVENTION

This field of the present application relates in general to a delta-sigma modulator, for example for use in a telecommunication system. The field of the present application further relates to a base-band radio frequency up-converter and to an active antenna arrangement. The field of the application also relates to a method of manufacturing a chipset with the delta-sigma modulator and a computer program product for manufacturing the chipset.

BACKGROUND OF THE INVENTION

The use of mobile communications networks has increased over the last decade. Operators of the mobile communications networks have increased the number of base stations in order to meet an increased demand for service by users of the mobile communications networks. The operators of the mobile communications network wish to purchase components for the base stations at a lower price and also wish to reduce operational expenses of the base station. Delta-sigma modulators driving a switched power amplifier have proven to meet these goals.

From A. Frappé, A. Flament, A. Kaiser, B. Stefanelli, A. Cathelin, "Design techniques for very high speed digital delta-sigma modulators aimed at all-digital RF transmitters", IEEE 2006, p. 1113 ff a delta-sigma modulator for providing radio-frequency signals according to the WCDMA standard is known. The architecture of this known delta-sigma modulator is a third-order low pass comprising three consecutive delta-sigma modulator stages (a first delta-sigma modulator stage, a second delta-sigma modulator stage, a third delta-sigma modulator stage) and a quantizer. An output signal of the last delta-sigma modulator stage (the third delta-sigma modulator stage in this example) is fed back as a first feedback signal to a second delta-sigma modulator stage input of the second delta-sigma modulator stage and a third delta-sigma modulator stage input of the third delta-sigma modulator stage. The first feedback signal is multiplied by a first factor of $\frac{1}{32}$ before the first feedback signal is input to the second delta-sigma modulator stage. In contrast hereto the first feedback signal is directly input to the third delta-sigma modulator stage input, which in effect is equivalent to a multiplication with a second factor having a value of one. A quantizer output signal is fed back as a second feedback signal to a first delta-sigma modulator stage input, the second delta-sigma modulator stage input, and the third delta-sigma modulator stage input. Before the second feedback signal is input to the first delta-sigma modulator stage input, the second feedback signal is multiplied by a third factor of the value $\frac{1}{8}$. Before the second feedback signal is input to the second delta-sigma modulator stage input the second feedback signal is multiplied by a fourth factor of the value $\frac{1}{4}$. Finally, before the second feedback signal is input to the third delta-sigma modulator stage input the second feedback signal is multiplied by a fifth factor of the value $\frac{1}{8}$.

The three delta-sigma modulator stages implement in connection with the first feedback signal and the second feedback signal a noise shaping transfer function with a notch at about 40 MHz. The chosen noise transfer function flattens the quantization noise at frequencies close to the output signal and thus extends the practically usable signal bandwidth. Two of the described third-order low pass delta-sigma modulators are combined in a digital up-converter to produce a 7,8 GS/s output signal for a digital power amplifier.

One of the issues of digital power amplifiers is that spectral distortions, measured in parameters such as ACPR, have to be within given limits to avoid interference in other channels of the same frequency band or outside the frequency band of a given communication system. As one of the possible origins of spectral distortions inter symbol interference caused by a final stage such as a digital power amplifier have been identified.

SUMMARY OF THE INVENTION

Known techniques such as pre-distortion of the final stage input signal have proved to fail in the event the final stage input signal origins from a delta-sigma modulator. It is an aspect of the teachings of the present disclosure to reduce the effect of inter symbol interference for delta-sigma modulated output signals.

An aspect of the present disclosure is a delta-sigma modulator for converting a delta-sigma modulator input signal into a sequence of delta-sigma modulator output values comprising an actual delta-sigma modulator output value and at least one preceding delta-sigma modulator output value preceding the actual delta-sigma modulator output value. The delta-sigma modulator comprises a first delta-sigma modulator stage for forming an integral of the delta-sigma modulator input signal and at least one first feedback signal multiplied with a first coefficient for providing a first stage output signal. The delta-sigma modulator further comprises a final delta-sigma modulator stage for forming an integral of a preceding stage output signal and the at least one first feedback signal multiplied with a second coefficient for providing a final stage output signal. The delta-sigma modulator further comprises a quantizer for quantizing the final stage output signal into the actual delta-sigma modulator output value. The delta-sigma modulator further comprises a feedback signal modifier for modifying the at least one first feedback signal in dependence of the actual delta-sigma modulator output value and the at least one preceding delta-sigma modulator output value.

The feedback signal modifier modifies the at least one first feedback signal such that the output signal of the delta-sigma modulator at least substantially compensates the effects of inter-symbol interference introduced, for example, by a final stage to which the output signal of the delta-sigma modulator is passed. Such a signal modification may be implemented as an equation which takes into account a specific number of last recent output values of the delta-sigma modulator.

Another aspect of the present disclosure is that the delta-sigma modulator further comprises at least one further delta-sigma modulator stage for forming an integral of a preceding stage output signal and the at least one first feedback signal multiplied with at least one further coefficient for providing a further stage output signal. With a first delta-sigma modulator stage, an at least one further delta-sigma modulator stage and a final delta-sigma modulator stage the delta-sigma modulator comprises at least a number of three stages which would render the delta-sigma modulator into a delta-sigma modulator of order three. The person skilled in the art will readily appreciate that he may choose any order of the delta-sigma modulator that is suitable for the planned application.

In another aspect of the present disclosure the feedback signal modifier is implemented as a look-up table. The modified first feedback signal takes into account a number n of consecutive symbols $x_{n-1} \ldots x_0$ that precede the actual output value $x_n$ and practically still have an influence on the output signal of the final stage. In case the sigma delta modulator provides a binary output signal $x_n$ and the unmodified first feedback signal has take into account two last recent delta-sigma output values, this results in $2^{n+1}$ separate states for which the feedback signal modifier has to provide modified feedback signals. For example, if the number of consecutive symbols that influence the inter-symbol interferences is two and the output signal of the finals stage is a binary signal then there are only $2^3$=eight different values for which the feedback modifier has to provide.

For this limited number of separate output values of the feedback modifier for all possible combinations the values can be pre-calculated and can be easily stored in the look-up table. For this purpose, for example, a shift register with three registers may be used to remember the current and the last two output values of the delta-sigma-modulator. The values of the shift register may be used to address a memory with eight memory cells. Each memory cell contains a predetermined modified value that is read out according to the applied address.

In the event a ternary output signal and again three last symbols have influence on the output value of the final stage, the feedback modifier has to provide for $3^3$=twenty-seven different modified feedback signals, which also easily can be stored in a look-up table.

In another aspect of the present disclosure the look-up table is enabled to be updated and the delta-sigma modulator further comprises a control unit for updating the look-up table. In the event that the inter symbol interference drifts over time, the values that are used to modify the at least first feedback signal are predetermined Thus time-dependent variations of the inter symbol interference can be compensated.

In another aspect of the present disclosure at least one of the first feedback signal or the second feedback signal corresponds to one of the output signal of the quantizer, the final stage output signal of the quantizer, or a difference signal formed by subtracting the final stage output signal from the output signal of the quantizer. Depending on the chosen architecture of the delta-sigma modulator the first feedback signal and the second feedback signal may have also different origins. However, all possible architectures are equivalent to each other and can be transformed into each other by mathematical transformations.

In another aspect of the present disclosure the lookup table produces the first coefficient and the second coefficient. A mathematically equivalent form of the modified first feedback signal is to use for each one of the first coefficients or the second coefficients a separate lookup table, or to have a single lookup table with an adequate number of parallel output values. Instead of multiplying each one of the first coefficients or the second coefficients with the modified first feedback signal, the first coefficients or the second coefficients may be already multiplied with the modified first feedback signal. Thus the multiplication of the at least first feedback signal with the first coefficients or the second coefficients is reduced to a read-out of the look-up table and does not need separate multipliers.

In another aspect of the present disclosure a base-band to radio frequency up-converter comprises a delta-sigma converter for converting a delta-sigma modulator input signal into a sequence of delta-sigma modulator output values comprising an actual delta-sigma modulator output value and at least one preceding delta-sigma modulator output value preceding the actual delta-sigma modulator output value. The delta-sigma modulator comprises a first delta-sigma modulator stage for forming an integral of the delta-sigma modulator input signal and at least one first feedback signal multiplied with a first coefficient for providing a first stage output signal. The delta-sigma modulator further comprises a final delta-sigma modulator stage for forming an integral of a preceding stage output signal and the at least one first feedback signal multiplied with a second coefficient for providing a final stage output signal. The delta-sigma modulator further comprises a quantizer for quantizing the final stage output signal into the actual delta-sigma modulator output value. The delta-sigma modulator further comprises a feedback signal modifier for modifying the at least one first feedback signal in dependence of the actual delta-sigma modulator output value and the at least one preceding delta-sigma modulator output value.

The delta-sigma modulator according to the present invention may be used as part of an up-converter in a transmitter of a mobile communication system. Such a transmitter may use a switched amplifier with a simple construction, as possible interference symbol distortions can be easily compensated with the delta-sigma modulator. The effort to reduce inter symbol distortions in the switched amplifier itself are known in the art to be technically costly, whereas the disclosed feedback modifier is technically relatively simple and results in a cost advantage.

Another aspect of the present disclosure is a method for converting a delta-sigma modulator input signal into a sequence of delta-sigma modulator output values comprising an actual delta-sigma modulator output value and at least one preceding delta-sigma modulator output value preceding the actual delta-sigma modulator output value. The method further comprises multiplying an at least one first feedback signal with a first coefficient and forming an integral of the delta-sigma modulator input signal and the multiplied at least one first feedback for providing a first stage output signal. The method further comprises multiplying the at least one first feedback signal with a second coefficient and forming an integral of a preceding stage output signal and the multiplied at least first one feedback signal for providing a final stage output signal. The method further comprises quantizing the final stage output signal into the actual delta-sigma modulator output value modifying the at least one first feedback signal in dependence of the actual delta-sigma modulator output value and the at least one preceding delta-sigma modulator output value.

In another aspect of the present disclosure a chip set comprises a delta-sigma modulator for converting a delta-sigma modulator input signal into a sequence of delta-sigma modulator output values comprising an actual delta-sigma modulator output value and at least one preceding delta-sigma modulator output value preceding the actual delta-sigma modulator output value. The delta-sigma modulator comprises a first delta-sigma modulator stage for forming an integral of the delta-sigma modulator input signal and at least one first feedback signal multiplied with a first coefficient for providing a first stage output signal. The delta-sigma modulator further comprises a final delta-sigma modulator stage for forming an integral of a preceding stage output signal and the at least one first feedback signal multiplied with a second coefficient for providing a final stage output signal. The delta-sigma modulator further comprises a quantizer for quantizing the final stage output signal into the actual delta-sigma modulator output value. The delta-sigma modulator further comprises a feedback signal modifier for modifying the at least one first feedback signal in dependence of the actual delta-sigma modulator output value and the at least one preceding delta-sigma modulator output value.

The delta-sigma modulator with the feedback signal modifier may be incorporated in a single chip or a set of chips that are adapted to interface with each other to implement the function.

Another aspect of the present disclosure is an active antenna array comprising a base band to frequency up-converter with a delta-sigma modulator for converting a delta-sigma modulator input signal into a sequence of delta-sigma modulator output values comprising an actual delta-sigma modulator output value and at least one preceding delta-sigma modulator output value preceding the actual delta-sigma modulator output value. The delta-sigma modulator comprises a first delta-sigma modulator stage for forming an integral of the delta-sigma modulator input signal and at least one first feedback signal multiplied with a first coefficient for providing a first stage output signal. The delta-sigma modulator further comprises a final delta-sigma modulator stage for forming an integral of a preceding stage output signal and the at least one first feedback signal multiplied with a second coefficient for providing a final stage output signal. The delta-sigma modulator further comprises a quantizer for quantizing the final stage output signal into the actual delta-sigma modulator output value. The delta-sigma modulator further comprises a feedback signal modifier for modifying the at least one first feedback signal in dependence of the actual delta-sigma modulator output value and the at least one preceding delta-sigma modulator output value.

As active antenna arrays comprise a plurality of radio frequency amplifiers the costs of such active antenna arrays can be reduced significantly if the costs for each radio frequency amplifier can be lowered. The delta-sigma modulator with the at least one first feedback modifier enables the use of simple and cost efficient radio frequency amplifiers and thus contributes to a reduction of the costs of such an active antenna array.

It is another aspect of the present disclosure to provide a method for manufacturing a delta-sigma modulator for converting a delta-sigma modulator input signal into a sequence of delta-sigma modulator output values comprising an actual delta-sigma modulator output value and at least one preceding delta-sigma modulator output value preceding the actual delta-sigma modulator output value, the delta-sigma modulator comprising a first delta-sigma modulator stage for forming an integral of the delta-sigma modulator input signal and at least one first feedback signal multiplied with a first coefficient for providing a first stage output signal. The delta-sigma modulator further comprises a final delta-sigma modulator stage for forming an integral of a preceding stage output signal and the at least one first feedback signal multiplied with a second coefficient for providing a final stage output signal. The delta-sigma modulator further comprises a quantizer for quantizing the final stage output signal into the actual delta-sigma modulator output value and a feedback signal modifier for modifying the at least one first feedback signal in dependence of the actual delta-sigma modulator output value and the at least one preceding delta-sigma modulator output value.

Another aspect of the present disclosure is a computer program product comprising a non-transitory computer-usable medium having control logic stored therein for causing a computer to manufacture a delta-sigma modulator for converting a delta-sigma modulator input signal into a sequence of delta-sigma modulator output values comprising an actual delta-sigma modulator output value and at least one preceding delta-sigma modulator output value preceding the actual delta-sigma modulator output value, the delta-sigma modulator comprising a first delta-sigma modulator stage for forming an integral of the delta-sigma modulator input signal and at least one first feedback signal multiplied with a first coefficient for providing a first stage output signal. The delta-sigma modulator further comprises a final delta-sigma modulator stage for forming an integral of a preceding stage output signal and the at least one first feedback signal multiplied with a second coefficient for providing a final stage output signal. The delta-sigma modulator further comprises a quantizer for quantizing the final stage output signal into the actual delta-sigma modulator output value and a feedback signal modifier for modifying the at least one first feedback signal in dependence of the actual delta-sigma modulator output value and the at least one preceding delta-sigma modulator output value.

DESCRIPTION OF THE FIGURES

FIG. 1 shows a first aspect of a delta-sigma modulator according to the present disclosure FIG. 2 shows a binary (or 1-bit) delta-sigma modulator output signal FIG. 3 shows a table with the history of the last n input values of a final stage in a first column and thereof resulting output signal values of a final stage in a second column

DETAILED DESCRIPTION OF THE INVENTION

Figure 4:
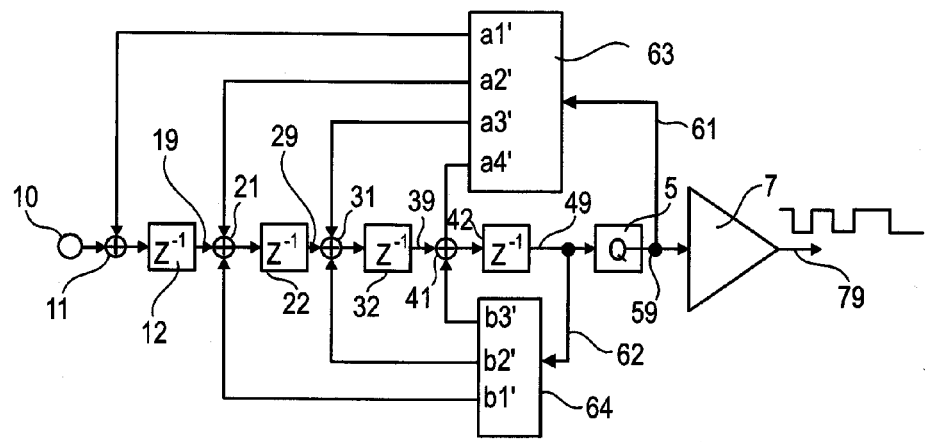
FIG. 4 shows another aspect of a delta-sigma modulator

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

FIG. 1 shows an aspect of a delta-sigma modulator 1 comprising a first delta-sigma modulator stage 11, 12, 13, a second delta-sigma modulator stage 21, 22, 23, 24, a third delta-sigma modulator stage 31, 32, 33, 34, a fourth delta-sigma modulator stage 41, 42, 43, 44, and a quantizer 5. The delta-sigma modulator 1 comprises a delta-sigma modulator input 10, which forms at the same time a first stage input 10 of the first delta-sigma modulator stage 11, 12, 13 for receiving a delta-sigma modulator input signal. In the present disclosure the input signal is a binary encoded signal comprising sixteen bits. The person skilled in the art will appreciate that according to the planned application and the planned accuracy the delta-sigma modulator may comprise less bits than sixteen bits or may comprise even more than sixteen bits.

A quantizer output 59 of the quantizer 5 forms at the same time a delta-sigma modulator output 59 for providing a delta-sigma modulator output signal. In the present disclosure the delta-sigma modulator output 59 is connected to a final stage 7, which is in the present disclosure a switching amplifier (class S amplifier). The technical character of this delta-sigma modulator is to convert an input signal with high amplitude resolution into a modulated signal with lower amplitude resolution while maintaining the signal properties within a certain frequency band. In the present disclosure the output signal of the quantizer 5 is a binary signal representing two symbols, the binary values "0" and "1". However, depending on the chosen design of the final stage the output signal of the delta-sigma modulator may be a ternary signal consisting of three symbols, for example the values "+1", "0", and "−1" or even a signal with more symbols.

The first delta-sigma modulator stage 11, 12, 13 comprises a first adder 11 for adding a first modified feedback signal 65 and the delta-sigma modulator input signal received at the delta-sigma modulator input 10 to a first adder output signal. The first adder output signal is fed to a first delay element 12. The first modified feedback signal 65 is multiplied in a first multiplier 13 by a first coefficient a1 before it is added by the first adder 11 to the delta-sigma modulator input signal. A first delay element output signal 19 of the first delay element 12 constitutes a first stage output signal 19 of the first delta-sigma modulator stage 11, 12, 13.

The second delta-sigma modulator stage 21, 22, 23, 24 comprises a second adder 21 for adding the first modified feedback signal 65, a second modified feedback signal 66, and the first stage output signal 19 to a second adder output signal. The second adder output signal is fed to a second delay element 22. The first modified feedback signal 65 is multiplied in a second multiplier 23 by a second coefficient a2 before it is added by the second adder 21. The second modified feedback signal 66 is multiplied in a third multiplier 24 by a third coefficient b1 before it is added by the second adder 21. A second delay element output signal constitutes a second stage output signal 29 of the second delta-sigma modulator stage 21, 22, 23, 24.

In respect to the second delta-sigma modulator stage 21, 22, 23, 24 the first delta-sigma modulator stage 11, 12, 13 is a preceding stage of the second delta-sigma modulator stage 21, 22, 23, 24. Consequently, in respect to the second delta-sigma modulator stage 21, 22, 23, 24 the first stage output signal 19 is a preceding stage output signal.

The third delta-sigma modulator stage 31, 32, 33, 34 comprises a third adder 31 for adding the first modified feedback signal 65, the second modified feedback signal 66, and the second stage output signal 29 to form a third adder output signal. The third adder output signal is fed to a third delay element 32. The first modified feedback signal 65 is multiplied in a fourth multiplier 33 by a fourth coefficient a3 before it is added by the third adder 31. The second modified feedback signal 66 is multiplied in a fifth multiplier 34 by a fifth coefficient b2 before it is added by the third adder 31. A third delay element output signal constitutes a third stage output signal 39 of the third delta-sigma modulator stage 31, 32, 33, 34.

In respect to the third delta-sigma modulator stage 31, 32, 33, 34 the second delta-sigma modulator stage 21, 22, 23, 24 is a preceding stage of the third delta-sigma modulator stage 31, 32, 33, 34. Consequently, in respect to the third delta-sigma modulator stage 31, 32, 33, 34 the second stage output signal 29 is a preceding stage output signal.

The fourth delta-sigma modulator stage 41, 42, 43, 44 comprises a fourth adder 41 for adding the first modified feedback signal 65, the second modified feedback signal 66, and the third stage output signal 39 to form a fourth adder output signal. The fourth adder output signal is fed to a fourth delay element 42. The first modified feedback signal 65 is multiplied in a sixth multiplier 43 by a sixth coefficient a4 before they are added by the fourth adder 41. The second modified feedback signal 66 is multiplied in a seventh multiplier 44 by a seventh coefficient b3 before it is added by the fourth adder 41. A fourth delay element output signal constitutes a fourth stage output signal 49 of the third delta-sigma modulator stage 41, 42, 43, 44.

In respect to the fourth delta-sigma modulator stage 41, 42, 43, 44 the third delta-sigma modulator stage 31, 32, 33, 34 is a preceding stage of the fourth delta-sigma modulator stage 41, 42, 43, 44. Consequently, in respect to the fourth delta-sigma modulator stage 41, 42, 43, 44 the third stage output signal 39 is a preceding stage output signal. In this aspect of the present disclosure the fourth delta-sigma modulator stage 41, 42, 43, 44 is also the final stage of the delta-sigma modulator 1.

As at least a part of the first modified feedback signal 65 is input to the first adder 11 and is delayed by the first delay element 12 for one clock period. The first adder 11 and the first delay element 12 form a first integrator 11, 12. In the same manner the second adder 21 and the second delay element 22 form a second integrator 21, 22; the third adder 31 and the third delay element 32 form a third integrator 31, 32; and the fourth adder 41 and the fourth delay element 42 form a fourth integrator 41, 42.

The present aspect of the disclosure discloses a delta-sigma modulator with four delta-sigma modulator stages (the first delta-sigma modulator stage 11, 12, 13, the second delta-sigma modulator stage 21, 22, 23, 24, the third delta-sigma modulator stage 31, 32, 33, 34, the fourth delta-sigma modulator stage 41, 42, 43, 44). This delta-sigma modulator 1 is called a fourth order delta-sigma modulator. Generally delta-sigma modulators comprising a number of n delta-sigma modulator stages are called n-order delta-sigma modulators. The person skilled in the art is familiar how to set the first coefficient a1, the second coefficient a2, the fourth coefficient a3 and the sixth coefficient a4 for the first modified feedback signal 65 and the third coefficient b1, the fifth coefficient b2 and the seventh coefficient b3 for the second modified feedback signal 66 to achieve a desired transfer function of the delta-sigma modulator 1. One example for the desired transfer function is to shift the noise signals into a frequency region where the noise signals are less disturbing. The resolution of the coefficients (the first coefficient a1, the second coefficient a2, the third coefficient b1, the fourth coefficient a3, the fifth coefficient b2, the sixth coefficient a4, and the seventh coefficient b3) may be chosen to the same resolution as the delta-sigma modulator input signal 10, e.g. to sixteen bit in the present disclosure. The resolution of the coefficients a1, a2, a3, a4, b1, b2, b3 may also be chosen to have lower resolution than the delta-sigma modulator input signal, e.g. four bits instead of sixteen bit in the present disclosure. Due to the feedback of the quantizer output signal the loss of accuracy caused by a reduced resolution of the coefficients a1, a2, a3, a4, b1, b2, b3 is permanently compensated and thus may stay within the design limits needed for a certain transfer function and application.

In the present aspect of the disclosure the first feedback signal 61 is derived from the output signal of the quantizer 5, whereas the second feedback signal 62 is derived from the fourth stage output signal 49 which is at the same time the input signal of the quantizer 5. A signal difference between the input signal of the quantizer 5 and the output signal of the quantizer 5 is usually termed an error signal. Sometimes this difference signal is fed back as the second feedback signal 62. Using the error signal or using the output signal of the last delta-sigma modulator stage is mathematically equivalent, apart from the fact that the coefficients (the first coefficient a1, the second coefficient a2, the third coefficient b1, the fourth coefficient a3, the fifth coefficient b2, the sixth coefficient a4, the seventh coefficient b3) have to be transposed into different values. However, in this aspect of the present disclosure the inventors found it to be more appropriate to use as the second feedback signal the fourth stage output signal 62 directly.

The aspect of the present disclosure is to reduce inter-symbol-interference (ISI) effects observed in the output data stream of the final stage 7 that follows the delta-sigma modulator 1. FIG. 2 shows the delta-sigma modulator output signal generating a 1-bit stream driving the final stage 7. This final stage 7 could be a clocked device, e.g. a flip flop, or a non-clocked device such as an inverter. In the aspect of the present disclosure the final stage 7 is a switched power amplifier (Switched PA).

In an ideal world, the final stage 7 will simply output an ideal bit stream as shown by the solid line 51 in FIG. 2. In reality however, many effects exist which will distort the output of the final stage 7. One such effect is ISI. In this case, the exact form of the final stage output signal for a given bit is not only dependent on the current bit value, but also on the history of previously processed values. In the example shown in FIG. 2, it is assumed that the final stage has a very poor edge rate, i.e. a switch from a binary output value of "0" to a binary output value of "1" and vice-versa cannot be completed in a single clock cycle. This is denoted by the dashed line 52. In real systems, the nature of ISI might be a mixture of the described effect and other effects, or it might be even based on a totally different effect, but all effects which have in common that they are deterministic and predictable provided that a sufficient history of the input signal to the final stage is available, can be, at least substantially, compensated with the aspect of the present disclosure.

In the described scenario in FIG. 2, we observe that the first binary output value "1" to be transmitted actually does not really represent a fractional value of 1.0 (see line 53) with the ideal final stage output values) at the output but rather a value of 0.7 (see line 54 with the non ideal finals stage output values). Similarly, the following binary value "0" represents rather a value of 0.3. Consequently a zero following a binary "1,0" pattern will produce an actual output value of 0.1 instead of a desired value of 0.0. Observing each possible case, a table can be generated that represents the output values of the final stage 7 as a function of its history as exemplified in FIG. 3. A first table column 55 with the heading "history" shows a first half of eight lines all possible combinations of bits for a binary signal of three consecutive bits and in a second half of eight lines the same combinations. A second table column 56 with the heading "ideal output" shows for the first half of eight lines an ideal output value of binary zero and in the second half of eight lines an ideal output value of binary one. A third column 57 with the heading "actual output" shows the fractional values the fictional final stage 7 would produce for each combination. This table could either be derived by simulation or measurement. The first line with history of three consecutive binary values zero and an output value of zero produces a fractional value of 0.0. This indicates that the output value of the final stage 7 does not depend on bits that are more recent than the last three recent bits. Similarly, the last line, the sixteenth line of the table, shows when an output value of binary one follows three consecutive binary ones it reaches the ideal value of 1.0, indicating again that the output signal of the final stage 7 does not depend on bits that are more recent than the last three recent bits.

The fact that the output values deviate from the intended bit values will ultimately cause distortion in the output signal. Digital-pre-distortion (DPD) techniques however cannot compensate the distortion caused by this effect since it cannot comprehend the coding details of the delta-sigma modulator. The delta-sigma modulator output bit stream as DPD is narrow band, whereas the delta-sigma modulator quantization noise causing this ISI effect is broadband.

To compensate for these distortions in the aspect of the present disclosure a first feedback signal modifier 63 is introduced in the first feedback path 61 of the delta-sigma modulator 1 for modifying the first feedback signal 61 and a second feedback signal modifier 64 is introduced in the second feedback path 62 of the delta-sigma modulator 1 for modifying the second feedback signal 62. Instead of directly feeding the ideal representatives of the binary values "1" and "0" back into the system, the first feedback modifier 63 and the second feedback modifier 64 respectively will each estimate the actual behavior of the final stage 7 for the given binary output value. For this the feedback modifier 63 and the second feedback modifier 64 will use the actual bit value $x_n$ and the previous m values $x_{n-1}, x_{n-2}, \ldots, x_{n-m}$ (for m=3 in the aspect of the present disclosure accordingly $x_{n-1}, x_{n-2}, x_{n-3}$) to choose the appropriate compensation values C1, C2. As such, the delta-sigma modulator system 1 will now comprehend the actual output including ISI effects and will try to compensate for ISI such that the relevant in-band part of the spectrum of the output best matches the spectrum of the incoming data stream at the delta-sigma modulator input 10. This substantially reduces or even eliminates spectral distortions caused by the ISI of the final stage 7. This aspect of the present disclosure improves spectral performance beyond the limits otherwise given for a technology or circuit style. This also potentially reduces costs which otherwise would have to be spend for a more complex design of the final stage 7 for avoiding ISI.

The first feedback signal modifier 63 and the second feedback signal modifier 64 may be implemented as calculator to calculate the first compensation value C1 and the second compensation value C2 according to an equation. The following equation may be used for calculating a compensation value $y_n$ of the first feedback signal modifier 62 for the exemplary data given in FIG. 3. The formula takes into account the actual output value $x_n$ of the delta-sigma modulator 1 and the last three recent output values $x_{n-1}, x_{n-2}, x_{n-3}$:

$$y_n = 0.55x_n + 0.3x_{n-1} + 0.0x_n x_{n-1} + 0.1x_{n-2} + 0.0x_{n-1}x_{n-2} + 0.0x_n x_{n-1}x_{n-2} + 0.05x_{n-3} + 0.0x_{n-2}x_{n-3} + 0.0x_{n-1}x_{n-2}x_{n-3} + 0.0x_n x_{n-1}x_{n-2}x_{n-3}$$

For reasons of keeping the design of the calculator simple a linear equation with a a larger number of parameters and coefficients was chosen to approximate the desired compensation values. The person skilled in the art may decide to accept a few flaws introduced by a simplified calculator design or may decide to use a non-linear equation, which introduces a little more complexity for the design of the feedback signal modifiers 62, 64 but may better approximate to the real world values.

In the present disclosure the first feedback signal modifier 63 and the second feedback signal modifier 64 comprise shift registers (not shown) for storing the most three recent first feedback signal values and the most recent second feedback signal values in order to memorize the history of the first feedback signal the second feedback signal. The output values of the three-bit shift register provide the actual output value $x_n$ of the delta-sigma modulator 1 and the last three recent output values $x_{n-1}, x_{n-2}, x_{n-3}$ for the calculation of the first modified feedback signal 65 and the second modified feedback signal 66.

In an alternative aspect of the present disclosure the first feedback signal modifier 63 is implemented as a first look-up table 63 and the second feedback signal modifier is implemented as a second look-up table 64. In the present disclosure the first look-up table 63 and the second look-up table 64 comprise shift registers (not shown) for storing the most three recent output values of the delta-sigma modulator 1 in order to memorize the history of the delta-sigma modulator output signal. The output values of the three-bit shift register are used to address the first look-up table 63 for reading out a first compensation value C1 to substitute the first feedback signal 61 and to address the second look-up table 64 for reading out a second compensation value C2 for substituting the second feedback signal 62. This aspect of the present disclosure is enabled to represent for each possible combination of input values any arbitrary value, so that any non-linear behavior of the final stage 7 can be perfectly compensated.

The most accurate way of providing the second compensation values for C2 would be to implement the second look-up-table 64 with a number of address lines that correspond to the output signal magnitude of the last stage output signal 49. In the aspect of the present disclosure shown in FIG. 4, where the output signal of the fourth delay element 42 is a 16-bit input signal the second look-up table would have to provide for a complete compensation $2^{16}$ different output values. However, using only a limited number of input values, for example the most significant four bits out of the sixteen bits reduces the size of the look-up table significantly. Due to the two feedback paths of the delta-sigma modulator the inaccuracy of a smaller second look-up table will be compensated within a few clock cycles. The person skilled in the art depending on a current application will balance accuracy (size of look-up table) versus performance and costs.

FIG. 4 shows another aspect of the present disclosure in which the first lookup-up table 63 comprises four columns: a first column for storing a first modified coefficient a1' which corresponds to the first compensation value C1 already multiplied with the first coefficient a1; a second column for storing a modified second coefficient a2' which corresponds to the first compensation value C1 already multiplied with the second coefficient a2; a fourth column for storing a fourth modified coefficient a3' which corresponds to the first compensation value C1 already multiplied with the fourth coefficient a3; and a sixth column for storing a sixth modified coefficient a4' which corresponds to the first compensation value C1 already multiplied with the sixth coefficient a4. In this aspect of the present disclosure the second look-up table 64 comprises three columns: a third column for storing a third modified coefficient b1' which correspond to the second compensation value C2 already multiplied with the third coefficient b1; a fifth column for storing a fifth modified coefficient b2' which corresponds to the second compensation value C2 already multiplied with the fifth coefficient b2; and a seventh column for storing a seventh modified coefficient b3' which corresponds to the second compensation value C2 already multiplied with the seventh coefficient b3. In this manner the multipliers (the first multiplier 13, the second multiplier 23, the third multiplier 24, the fourth multiplier 33 the fifth multiplier 34, the sixth multiplier 43, and the seventh multiplier 44) are obsolete. The output value of the first look-up table column is directly passed to the first adder 11; the output value of the second look-up table column and the output value of the third look-up table column are directly passed to the second adder 21; the output value of the fourth look-up table column and the output value of the fifth look-up table column are directly passed to the third adder 31; and the output value of the sixth look-up table column and the output value of the seventh look-up table column are directly passed to the fourth adder 41.

It should be noted that in the event only a single feedback path 65 is used for the quantizer output signal 61 the complexity of the delta-sigma modulator does not increase significantly by the fact that the feedback coefficients become fractional. No fractional multiplications have actually to be performed in case the output values of the delta-sigma modulator 1 are limited to 1, 0, and −1 as in the event of a multiplication with a value of one the actual value has to be chosen, in the event of a multiplication with zero the result is always zero and in the event of a multiplication with −1 a simple sign operation has to be performed on the respective feedback coefficients.

In case that the effect of the ISI is substantially invariant, the compensation values of the first look-up table 63 and the second look-up table 64 may be hardwired in the design or stored as fixed values in a non-volatile memory, such as a read-only memory (ROM) or electrically erasable memory (EEPROM). The compensation values for the first look-up table 63 and the second look-up table 64 may be established as constant values for all delta-sigma modulators 1 of a production series, or if a higher accuracy is needed may be calculated individually for each set consisting of a delta-sigma modulator 1 and a final stage 7 during production and stored individually for each set 1, 7.

Figure 5:
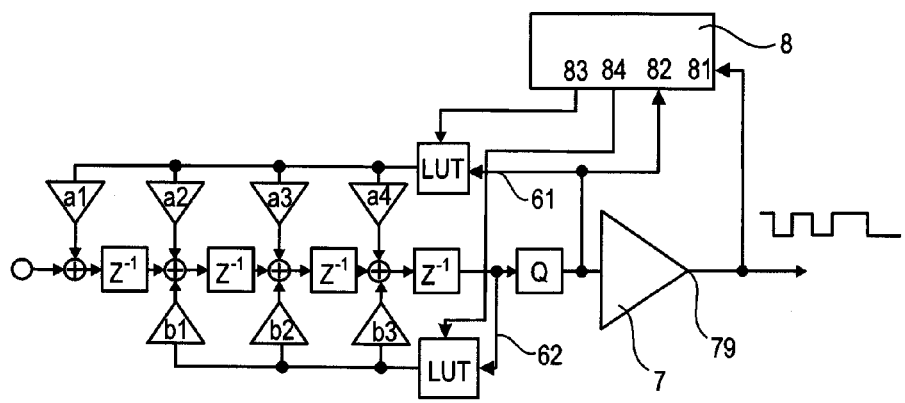
FIG. 5 shows a delta-sigma modulator with a control device for up-dating the content of the first look-up table and the second look-up table.

However, the ISI effect may be time variant, e.g. may change with ambient temperature or change with aging. FIG. 5 shows another aspect of the present disclosure with a control device 8 for up-dating the content of the first look-up table 63 and the second look-up table 64. To compensate changes of the ISI behavior of the final stage 7 the control device 8 is enabled to disconnect the delta-sigma modulator output 59 from the final stage input 70. The control device 8 feeds instead via a control device sample signal output 82 a sample stream of bits, for example all the possible combinations of three "historic" bits and an actual value as depicted in the first column 55 and the second column 56 of the table shown in FIG. 2 to the final stage input 70. The final stage output 79 is connected to a control device input 81 to enable the control device 8 to measure the final stage output signal at the final stage output 79. From the deviation of the final stage output signal 79 to the ideal output signal the control device 8 calculates first compensation values C1 for the first look-up table 63 and second compensation values C2 for the second look-up table 64. At a first compensation output 83 the control device 8 provides the first compensation values for updating the first look-up table 63 and at a second compensation output 84 the control device 8 provides the second compensation values C2 for updating the second look-up table 64 accordingly. After the first look-up table 63 and the second look-up table 64 are up-dated, the control device 8 connects the delta-sigma modulator output 59 again to the final stage input 70.

Alternatively the control device 8 may be configured such that the control device 8 performs the adaption of the first look-up table 63 and the second look-up table 64 during the normal operation of the delta-sigma modulator 1 without the need of interrupting the delta-sigma modulator operation mode and switch to a calibration mode. For this purpose the delta-sigma modulator output signal 59 and its history is analyzed and compared with the final stage output signal 79. In the event the final stage output signal deviates from the ideal signal too much, a new first compensation value C1 and a new second compensation value C3 is calculated on the basis of the final stage input signal history and the actual final stage input value and the first look-up table 63 and the second look-up table 64 are up-dated on the fly. The update values for the first look-up table 63 and the second look-up table 64 may be calculated continuously, or from time to time. This mode needs more calculation power than the aforementioned calibration mode with predefined test samples, but it avoids having the operation mode interrupted by a calibration mode.

The described delta-sigma modulator is not limited to a single bit stream and a delta-sigma modulator as depicted. The principle may even be applied to a single stage delta-sigma modulator, in which case the first and the last delta-sigma modulator are identical. The described invention is also applicable for other designs of delta-sigma modulators. For example in the present aspect of the disclosure the at least one first feedback signal is derived from the output signal of the quantizer 5 and is added to each of the first stage input signal, the second stage input signal, the third stage input signal and the fourth stage input signal. However, according to the chosen design the person skilled in the art may decide to set one or more of the first coefficient a1, the second coefficient a2, the fourth coefficient a3, or the sixth coefficient a4 to zero, which will result in that the at least first feedback signal is not fed to each of the first adder 11, the second adder 21, the third adder 31, or the fourth adder 41.

Furthermore in the above described aspect of the present disclosure the second feedback signal is derived from the output of the last delta-sigma modulator stage which is in the present aspect of the disclosure the fourth delta-sigma modulator stage 41, 42, 43, 44. Again, with respect to an actual application the person skilled in the art may decide not to feed the optional second feedback signal 66 to each of the second adder 21, the third adder 31, or the fourth adder 41, for example by setting at least one of the third coefficient b1, the fifth coefficient b2, or the seventh coefficient b3 to zero. The person skilled in the art may even decide to use as a source of the second feedback signal 66 another output than the fourth stage output 49. There are also designs of delta-sigma modulators where at least two optional second feedback signals from different stage outputs are fed back, or for each feedback signal only a single adder with multiple inputs is provided. Mathematically these different designs are equivalent, but depending on the chosen application may have advantages in respect to calculation accuracy when adders and multipliers with a restricted number of bits are used in real world applications. The person skilled in the art will appreciate that he or she can choose the most appropriate design of a delta-sigma modulator for purpose and still can benefit from the teaching of the present disclosure; whatever number of feedback signal modifiers is required for the chosen design. In the event the chosen design consists of more than two feedback signals just an adequate number of feedback signal modifiers have to be foreseen.

Figure 6:
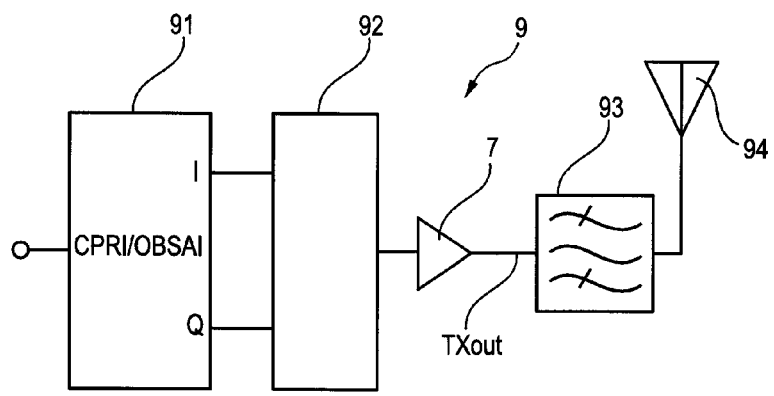
FIG. 6 shows an application of a delta-sigma modulator according to the present disclosure in a base-band to radio frequency up-converter according to the present disclosure in a radio communication system

FIG. 6 shows as another aspect of the present disclosure the use of the delta-sigma modulator 1 according to the present disclosure in a base-band to radio frequency up-converter in a radio station 9. The radio station 9 may for example be part of an antenna array system for a mobile communications network. As this aspect of the present disclosure relates only to the transmitting part of the radio station 9, only the transmitting part is shown, although the person skilled in the art will appreciate that the radio station for the mobile communications network will also include circuit arrangements for receiving the radio signal. For reasons of clarity only the most essential components are presented in FIG. 6. In the context of this disclosure the radio station 9 is part but is not limited to a base transceiver station, as known from GSM networks, as well as a node B (known from UMTS/3G networks) or enhanced node B, and similar units used in other mobile communication network.

A base band signal, which comprises encoded data, e.g. encoded voice data, is received via a CPRI/OBSAI interface 91 as I-samples and Q-samples. The I-samples and Q-samples are passed to a base band to radio frequency up-converter 92. The up-converter 92 comprises for example a first delta-sigma modulator (not shown) which corresponds to the delta-sigma modulator 1 of the present aspect of the disclosure for up-converting the I-samples and a second delta-sigma modulator (not shown) which corresponds to the delta-sigma modulator 1 of the aspect of the present disclosure for up-converting the Q-samples. Radio frequency samples TX of the base band to radio frequency up-converter 92 are passed to a switching power amplifier 7. The switching power amplifier 7 amplifies the radio signal TX and passes the amplified radio signal $TX_{out}$ through a band pass filter 93 to an antenna 94.

The present disclosure further relates to a computer program product embedded on a computer readable medium. The computer program product comprises executable instructions for the manufacture of the delta-sigma modulator of the present disclosure.

In addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CO-ROM, OVO-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HOL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

While various embodiments of the present invention have been described above, it should be understood that they have been presented by way of example, and not limitation. It will be apparent to persons skilled in the relevant arts that various changes in form and detail can be made therein without departing from the scope of the invention. Thus, the present invention should not be limited by any of the above-described exemplary embodiments, but should be defined only in accordance with the following claims and their equivalents.

The invention claimed is:

1. A delta-sigma modulator comprising
   a delta-sigma modulator input for receiving a delta-sigma modulator input signal;
   a delta-sigma modulator output for providing a sequence of delta-sigma modulator output values;

a first delta-sigma modulator stage for forming an integral of the delta-sigma modulator input signal and at least one first feedback signal multiplied with a first coefficient for providing a first stage output signal a final delta-sigma modulator stage for forming an integral of a preceding stage output signal and the at least one first feedback signal multiplied with a second coefficient for providing a final stage output signal a quantizer for quantizing the final stage output signal into the sequence of delta-sigma modulator output values a feedback signal modifier for modifying the at least one first feedback signal as a function of a current delta-sigma modulator output value and one of a at least one preceding delta-sigma modulator output value that is temporaly preceding the current delta-sigma modulator output value.

2. The delta-sigma modulator according to claim 1 comprising at least one further delta-sigma modulator stage for forming an integral of a preceding stage output signal and the at least one first feedback signal multiplied with at least one further coefficient for providing a further stage output signal.

3. The delta-sigma modulator according to claim 1 wherein the feedback signal modifier is implemented as a look-up table.

4. The delta-sigma modulator according to claim 3 wherein the look-up table is enabled to be updated and the delta-sigma modulator further comprises a control unit for updating the look-up table.

5. The delta-sigma modulator according to claim 1 wherein at least one of the first feedback signal or one of the second feedback signal is one of the output signal of the quantizer, the final stage output signal of the quantizer, or a difference signal formed by subtracting the final stage output signal from the output signal of the quantizer.

6. The delta-sigma modulator according to claim 3 wherein the look-up table output signal is at least one of the first or the second feedback signal.

7. The delta-sigma modulator according to claim 3 wherein the lookup table produces the at least first coefficient and the at least second coefficient.

8. A base-band to radio frequency up-converter comprising a delta-sigma converter, comprising
a delta-sigma modulator input for receiving a delta-sigma modulator input signal;
a delta-sigma modulator output for providing a sequence of delta-sigma modulator output values;
a first delta-sigma modulator stage for forming an integral of the delta-sigma modulator input signal and at least one first feedback signal multiplied with a first coefficient for providing a first stage output signal
a final delta-sigma modulator stage for forming an integral of a preceding stage output signal and the at least one first feedback signal multiplied with a second coefficient for providing a final stage output signal
a quantizer for quantizing the final stage output signal into the sequence of delta-sigma modulator output values
a feedback signal modifier for modifying the at least one first feedback signal as a function of a current delta-sigma modulator output value that is temporaly preceding the current delta-sigma modulator output value.

9. A method for converting a delta-sigma modulator input signal into a sequence of delta-sigma modulator output values comprising the steps of:
receiving delta-sigma modulator input signal at a delta-signal modulator input;
providing a sequence of delta-sigma modulator output values at a delta-sigma modulator output;

multiplying a at least first feedback signal with a first coefficient and forming an integral of the delta-sigma modulator input signal and the multiplied at least first feedback for providing a first stage output signal
multiplying the at least first feedback signal with a second coefficient and forming an integral of a preceding stage output signal and the multiplied at least first feedback signal for providing a final stage output signal
quantizing the final stage output signal into the sequence of delta-sigma modulator output values
continuously modifying the at least one first feedback signal as a function of a current delta-sigma modulator output value that is temporaly preceding the current delta-sigma modulator output value.

10. A chip set comprising a delta-sigma modulator for converting a delta-sigma modulator input signal into a sequence of delta-sigma modulator output values, comprising
a delta-sigma modulator input for receiving delta-sigma modulator input signal;
a delta-sigma modulator output for providing a sequence of delta-sigma modulator output values;
a first delta-sigma modulator stage for forming an integral of the delta-sigma modulator input signal and at least one first feedback signal multiplied with a first coefficient for providing a first stage output signal
a final delta-sigma modulator stage for forming an integral of a preceding stage output signal and the at least one first feedback signal multiplied with a second coefficient for providing a final stage output signal
a quantizer for quantizing the final stage output signal into the sequence of delta-sigma modulator output values
a feedback signal modifier for continuously modifying the at least one first feedback signal as a function of a current delta-sigma modulator output value that is temporaly preceding the current delta-sigma modulator output value.

11. An active antenna array comprising a base band to frequency up-converter with a delta-sigma modulator, the delta-sigma modulator comprising,
a delta-sigma modulator input for receiving a delta-sigma modulator input signal;
a delta-sigma modulator output for providing a sequence of delta-sigma modulator output values;
a first delta-sigma modulator stage for forming an integral of the delta-sigma modulator input signal and at least one first feedback signal multiplied with a first coefficient for providing a first stage output signal
a final delta-sigma modulator stage for forming an integral of a preceding stage output signal and the at least one first feedback signal multiplied with a second coefficient for providing a final stage output signal
a quantizer for quantizing the final stage output signal into the sequence of delta-sigma modulator output values
a feedback signal modifier for modifying the at least one first feedback signal as a function of a current delta-sigma modulator output value that is temporaly preceding the current delta-sigma modulator output value.

12. A method for manufacturing a delta-sigma modulator, the delta-sigma modulator comprising
a delta-sigma modulator input for receiving a delta-sigma modulator input signal;
a delta-sigma modulator output for providing a sequence of delta-sigma modulator output values;
a first delta-sigma modulator stage for forming an integral of the delta-sigma modulator input signal and at least one first feedback signal multiplied with a first coefficient for providing a first stage output signal a final delta-sigma modulator stage for forming an integral of a preceding stage output signal and the at least one first feedback signal multiplied with a second coefficient for providing a final stage output signal a quantizer for quantizing the final stage output signal into the sequence of delta-sigma modulator output value a feedback signal modifier for modifying the at least one first feedback signal as a function of a current delta-sigma modulator output value that is temporally preceding the current delta-sigma modulator output value.

13. A computer program product comprising a non-transitory computer-usable medium having control logic stored therein for causing a computer to manufacture a delta-sigma-modulator, the delta-sigma modulator comprising a delta-sigma modulator input for receiving delta-sigma modulator input signal;

a delta-sigma modulator output for providing a sequence of delta-sigma modulator output values;

a first delta-sigma modulator stage for forming an integral of the delta-sigma modulator input signal and at least one first feedback signal multiplied with a first coefficient for providing a first stage output signal a final delta-sigma modulator stage for forming an integral of a preceding stage output signal and the at least one first feedback signal multiplied with a second coefficient for providing a final stage output signal a quantizer for quantizing the final stage output signal into the sequence of delta-sigma modulator output values a feedback signal modifier for continuously modifying the at least one first feedback signal as a function of a current delta-sigma modulator output value that is temporaly preceding the current delta-sigma modulator output value.

14. The delta-sigma modulator of claim 1, further comprising a shift register for storing the actual delta-sigma modulator output value and the at least one proceeding delta-sigma modulator output value and the at least one delta-sigma modulator output value.

\* \* \* \* \*

UNITED STATES PATENT AND TRADEMARK OFFICE
CERTIFICATE OF CORRECTION

| | | |
|---|---|---|
| PATENT NO. | : 8,884,796 B2 | Page 1 of 1 |
| APPLICATION NO. | : 13/277688 | |
| DATED | : November 11, 2014 | |
| INVENTOR(S) | : Horst Wagner et al. | |

It is certified that error appears in the above-identified patent and that said Letters Patent is hereby corrected as shown below:

In the Claims,

Column 15, line 64, Claim 9, lines 4-5, "receiving delta-sigma modulator input signal at a delta-signal" should read -- receiving a delta-sigma modulator input signal at a delta-sigma --;

Column 16, line 20, Claim 10, line 5, "receiving delta-sigma" should read -- receiving a delta-sigma --;

Column 17, line 17, Claim 13, line 5, "receiving delta-sigma" should read -- receiving a delta-sigma --.

Signed and Sealed this
Seventeenth Day of March, 2015

Michelle K. Lee
*Director of the United States Patent and Trademark Office*